US008030656B2

(12) United States Patent
Chung

(10) Patent No.: US 8,030,656 B2
(45) Date of Patent: Oct. 4, 2011

(54) PIXEL, ORGANIC LIGHT EMITTING DISPLAY AND ASSOCIATED METHODS, IN WHICH A PIXEL TRANSISTOR INCLUDES A NON-VOLATILE MEMORY ELEMENT

(75) Inventor: Kyung-hoon Chung, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 509 days.

(21) Appl. No.: 12/213,541

(22) Filed: Jun. 20, 2008

(65) Prior Publication Data

US 2008/0315759 A1 Dec. 25, 2008

(30) Foreign Application Priority Data

Jun. 22, 2007 (KR) ........................ 10-2007-0061496

(51) Int. Cl.
*H01L 51/52* (2006.01)

(52) U.S. Cl. ............ 257/71; 257/72; 257/298; 257/316; 257/E51.018

(58) Field of Classification Search ............ 257/E51.006
See application file for complete search history.

(56) References Cited

U.S. PATENT DOCUMENTS 5,990,629 A 11/1999 Yamada et al.
6,229,506 B1 5/2001 Dawson et al.
2002/0113268 A1 8/2002 Koyama et al.
2005/0007316 A1 1/2005 Akimoto et al.
2006/0118869 A1 6/2006 Lan et al.
2006/0145964 A1 7/2006 Park et al.
2006/0220542 A1 10/2006 Suh et al.
2006/0221662 A1 10/2006 Park et al.
2006/0244689 A1 11/2006 Osame et al.
2006/0262051 A1 * 11/2006 Kim et al. ........................ 345/76
2007/0057877 A1 3/2007 Choi et al.
2008/0088543 A1 4/2008 Shibusawa
2008/0211024 A1 9/2008 Kato et al.
2008/0218448 A1 * 9/2008 Park et al. ........................ 345/76
2008/0246698 A1 * 10/2008 Eom ............................... 345/76

FOREIGN PATENT DOCUMENTS

CN 1 801 298 A 7/2006
JP 04-299864 A 10/1992
JP 2000-284751 A 10/2000
JP 2001-298100 A 10/2001
JP 2002-514320 T 5/2002
JP 2004-341144 A 12/2004
JP 2006-113524 A 4/2006
JP 2006-114875 A 4/2006
JP 2006-285180 A 10/2006

(Continued)

*Primary Examiner* — Stephen W Smoot
(74) *Attorney, Agent, or Firm* — Lee & Morse, P.C.

(57) ABSTRACT

A pixel includes an organic light emitting diode, a first transistor having a source coupled to a first power source, a control gate coupled to a first node, and a drain coupled to a second node, wherein the first transistor includes a floating gate and an insulating layer between the floating gate and the control gate, a second transistor having a source coupled to a data line, a drain coupled to the first node, and a gate coupled to a scan line, a third transistor having a source coupled to the second node, a drain coupled to the organic light emitting diode, and a gate coupled to one of a light emitting control line and the scan line, and a capacitor coupled between the first power source and the first node.

16 Claims, 4 Drawing Sheets

FOREIGN PATENT DOCUMENTS

| | | | |
|---|---|---|---|
| JP | 2007-057877 | A | 3/2007 |
| JP | 2008-522440 | T | 6/2008 |
| KR | 10-2006-0100963 | A | 9/2006 |
| KR | 10-2006-0110202 | A | 10/2006 |
| WO | WO 98/48403 | A1 | 10/1998 |
| WO | WO 2006/054189 | A1 | 5/2006 |

* cited by examiner

PIXEL, ORGANIC LIGHT EMITTING DISPLAY AND ASSOCIATED METHODS, IN WHICH A PIXEL TRANSISTOR INCLUDES A NON-VOLATILE MEMORY ELEMENT

BACKGROUND OF THE INVENTION

1. Field of the Invention

Embodiments relate to a pixel, an organic light emitting display exhibiting improved image quality, and a method of driving the same.

2. Description of the Related Art

Active matrix-type flat panel displays that display images using thin film transistors have been widely used. An organic light emitting display may exhibit excellent luminous efficiency, brightness, and viewing angle, and may have a rapid response speed. The organic light emitting display displays images by using a plurality of organic light emitting diodes (OLEDs). The organic light emitting diode may include an anode electrode, a cathode electrode, and an organic light emitting layer between the anode electrode and the cathode electrode.

In the organic light emitting display, the semiconductor layer of each transistor may be formed of polysilicon. However, polysilicon-based transistors may exhibit differences in mobility and threshold voltage, which may cause deviations in the current flowing in the pixels. A pixel circuit may be constructed that compensates for the threshold voltage. However, such a pixel circuit may be complicated and may occupy an increased area, which may be problematic as the resolution (pixels per inch, ppi) of the display panel is increased because it presents difficulties in reducing the pitch of the pixels.

SUMMARY OF THE INVENTION

Embodiments are therefore directed to a pixel, an organic light emitting display and a method of driving the same, which substantially overcome one or more of the problems due to the limitations and disadvantages of the related art.

It is therefore a feature of an embodiment to provide a pixel, an organic light emitting display and a method of driving the same, in which a pixel transistor includes a non-volatile memory element.

At least one of the above and other features and advantages may be realized by providing a pixel, including an organic light emitting diode, a first transistor having a source coupled to a first power source, a control gate coupled to a first node, and a drain coupled to a second node, wherein the first transistor includes a floating gate and an insulating layer between the floating gate and the control gate, a second transistor having a source coupled to a data line, a drain coupled to the first node, and a gate coupled to a scan line, a third transistor having a source coupled to the second node, a drain coupled to the organic light emitting diode, and a gate coupled to one of a light emitting control line and the scan line, and a capacitor coupled between the first power source and the first node.

The gate of the third transistor may be coupled to the light emitting control line. The first, second, and third transistors may be PMOS transistors. The first transistor may be an NMOS transistor, and the second and third transistors may be PMOS transistors. The gate of the third transistor may be coupled to the scan line, and the third transistor may be in an on-state when the second transistor is in an off-state. The first and second transistors may be PMOS transistors, and the third transistor may be an NMOS transistor.

At least one of the above and other features and advantages may also be realized by providing an organic light emitting display, including a pixel unit having a plurality of pixels, a data driver coupled to data lines of the pixel unit, and a scan driver coupled to scan lines of the pixel unit. Each pixel may include an organic light emitting diode, a first transistor having a source coupled to a first power source, a control gate coupled to a first node, and a drain coupled to a second node, wherein the first transistor includes a floating gate and an insulating layer between the floating gate and the control gate, a second transistor having a source coupled to a data line, a drain coupled to the first node, and a gate coupled to a scan line, a third transistor having a source coupled to the second node, a drain coupled to the organic light emitting diode, and a gate coupled to one of a light emitting control line and the scan line, and a capacitor coupled between the first power source and the first node.

The scan driver may be coupled to light emitting control lines of the pixel unit, and the gate of the third transistor of each pixel may be coupled to a light emitting control line. The first, second, and third transistors may be PMOS transistors. The first transistor may be an NMOS transistor, and the second and third transistors may be PMOS transistors. The gate of the third transistor of each pixel may be coupled to the scan line, and the third transistor of each pixel may be in an on-state when the second transistor of the pixel is in an off-state. The first and second transistors may be PMOS transistors, and the third transistor may be an NMOS transistor.

At least one of the above and other features and advantages may also be realized by providing a method of manufacturing an organic light emitting display, including determining a current flowing into a first transistor of a pixel, determining a deviation of a threshold voltage of the first transistor using the determined current, and compensating for the deviation of the threshold voltage. The first transistor may be a floating gate transistor, and compensating for the deviation of the threshold voltage may include storing a voltage corresponding to the deviation of the threshold voltage in the first transistor.

Storing the voltage corresponding to the deviation of the threshold voltage may include controlling an amount of electrons stored in a floating gate of the floating gate transistor. The method may further include extracting electrons stored in the floating gate into a channel region of the first transistor to lower the threshold voltage. Extracting electrons into the channel region may include providing a high state voltage to a source of the first transistor and providing a low state voltage to a control gate of the first transistor. The method may further include injecting electrons into the floating gate to raise the threshold voltage. Injecting electrons into the floating gate may include providing a low state voltage to a source of the first transistor and providing a high state voltage to a control gate of the first transistor.

BRIEF DESCRIPTION OF THE DRAWINGS

The above and other features and advantages will become more apparent to those of ordinary skill in the art by describing in detail example embodiments with reference to the attached drawings, in which.

DETAILED DESCRIPTION OF THE INVENTION

Figure 1:
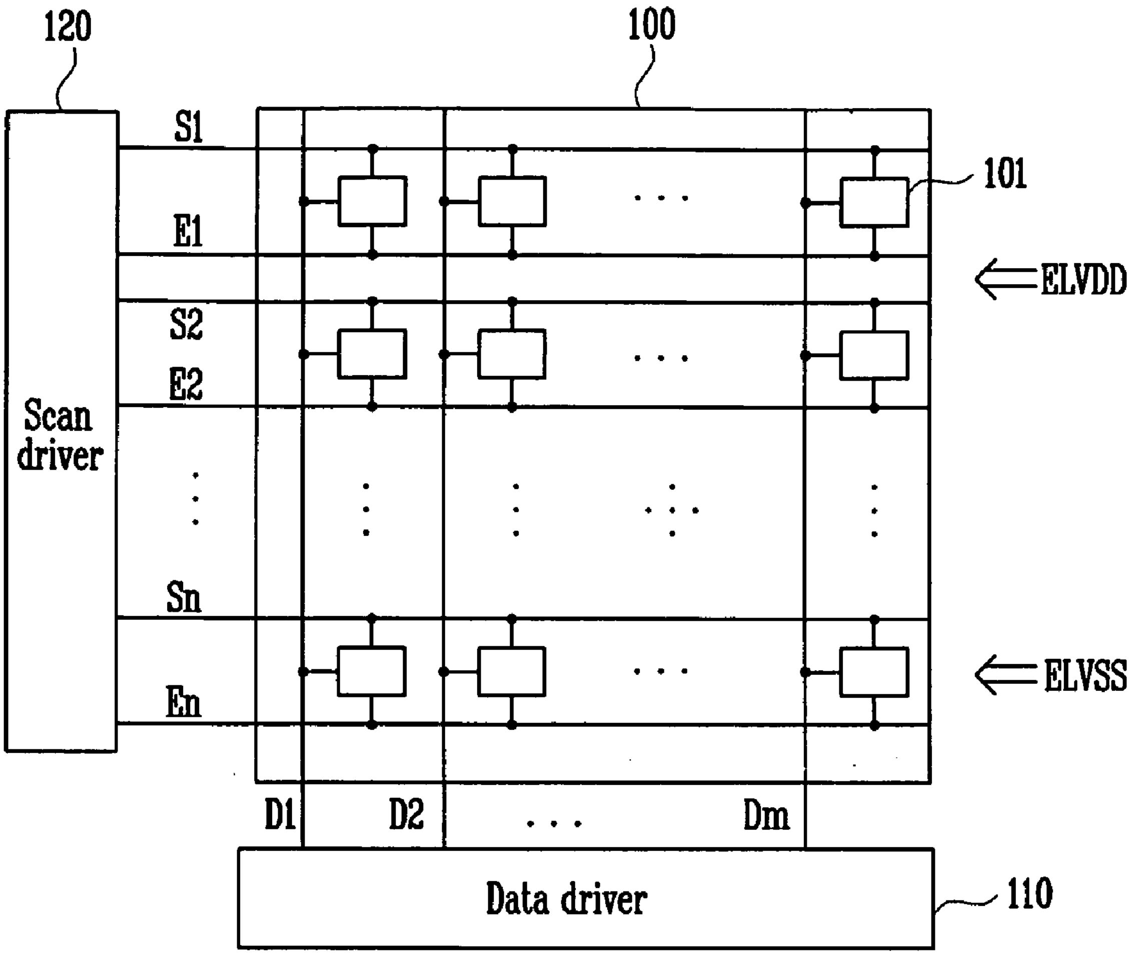
FIG. 1 illustrates a schematic view of an organic light emitting display according to an embodiment.

Korean Patent Application No. 10-2007-0061496, filed on Jun. 22, 2007, in the Korean Intellectual Property Office, and entitled: "Organic Light Emitting Display and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Where an element is described as being coupled to a second element, the element may be directly coupled to the second element, or may be indirectly coupled to the second element via one or more other elements. Further, where an element is described as being coupled to a second element, it will be understood that the elements may be electrically coupled, e.g., in the case of transistors, capacitors, power sources, nodes, etc. Where two or more elements are described as being coupled to a node, the elements may be directly coupled to the node, or may be coupled via conductive features to which the node is common. Thus, where embodiments are described or illustrated as having two or more elements that are coupled to a common point, it will be appreciated that the elements may be coupled to respective points on a conductive feature that extends between the respective points.

FIG. 1 illustrates a schematic view of an organic light emitting display according to an embodiment. Referring to FIG. 1, the organic light emitting display includes a pixel unit 100, a data driver 110, and a scan driver 120.

The pixel unit 100 includes a plurality of pixels 101. Each pixel 101 includes an organic light emitting diode configured to emit light corresponding to a flow of current. The pixel unit 100 includes n scan lines S1, S2, . . . Sn-1, and Sn transferring scan signals, the scan lines extending in a row direction, n light emitting control lines E1, E2, . . . En-1, and En transferring light emitting control signals, the light emitting control lines extending in the row direction, and m data lines D1, D2, . . . Dm-1, and Dm transferring data signals, the data lines extending in a column direction.

The pixel unit 100 is coupled to external first and second power sources ELVDD and ELVSS, respectively. The pixel unit 100 displays an image by light emitting the organic light emitting diodes using the scan signals, the data signals, the light emitting control signals, the first power source ELVDD and the second power source ELVSS. A low state voltage may be provided by the second power source ELVSS during an image-display operation of the organic light emitting diode, i.e., when current flows in the organic light emitting diode to display images. As described in detail below, one or both of the first and second power sources may supply various voltages, such that ELVDD may supply a higher or lower voltage than ELVSS, in order to facilitate compensation of a threshold voltage of a non-volatile memory element.

The data driver 110 generates the data signals by receiving video data with red, blue, and green components, and applies the data signals to the pixel unit 100. The data driver 110 applies the data signals to the pixel unit 100 via the data lines D1, D2, . . . , Dm-1, and Dm of the pixel unit 100.

The scan driver 120 includes a scan driving circuit generating the scan signals and a light emitting control signal driving circuit generating the light emitting control signals, and applies the scan signals and light emitting control signals to the pixel unit 100. The scan driving circuit is coupled to the scan lines S1, S2, . . . , Sn-1, and Sn to transfer the scan signals to a specific row of the pixel unit 100. The light emitting control signal driving circuit is coupled to the light emitting control lines E1, E2, . . . , En-1, and En to transfer the light emitting control signals to a specific row of the pixel unit 100.

In an implementation, the light emitting control signal driving circuit may be coupled to first and second light emitting control lines to transfer the first and second light emitting control signals to a specific row of the pixel unit 100. The data signals output from the data driver 110 are supplied to the pixel 101 to which the scan signals are transferred. As a result, a driving current may be generated in the pixel 101, the generated driving current being supplied to the organic light emitting diode by the first and second light emitting control signals.

Figure 2:
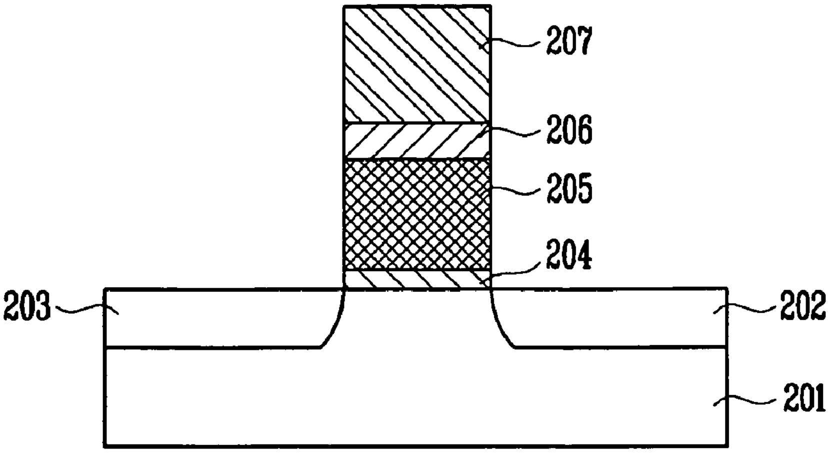
FIG. 2 illustrates a cross-sectional view of a transistor having a non-volatile memory element.

FIG. 2 illustrates a cross-sectional view of a transistor having a non-volatile memory (NVM) element, which may be implemented in each pixel of the organic light emitting display shown in FIG. 1. Referring to FIG. 2, an insulating film 204, e.g., a tunnel oxide film, may be formed on a silicon substrate 201, e.g., an N-type silicon substrate. The silicon substrate 201 may be polysilicon. A floating gate 205 may be formed on the oxide film, an oxide-nitride-oxide (ONO) layer 206 may be formed on the floating gate 205, and a control gate 207 may be formed on the ONO layer 206. A source 202 and a drain 203 may be formed on sides of the gate electrode made up of the floating gate 205 and the control gate 207.

To raise the threshold voltage of the NVM element, hot electrons beyond the energy barrier of the tunnel oxide film may be injected into a potential well formed in the floating gate 205 using hot electron injection. The injection of electrons into the floating gate may raise the threshold voltage of the transistor.

To lower the threshold voltage of the NVM element, electrons stored in the potential well of the floating gate 205 may be extracted into the silicon substrate using tunneling. The removal of electrons from the floating gate may lower the threshold voltage.

Figure 3:
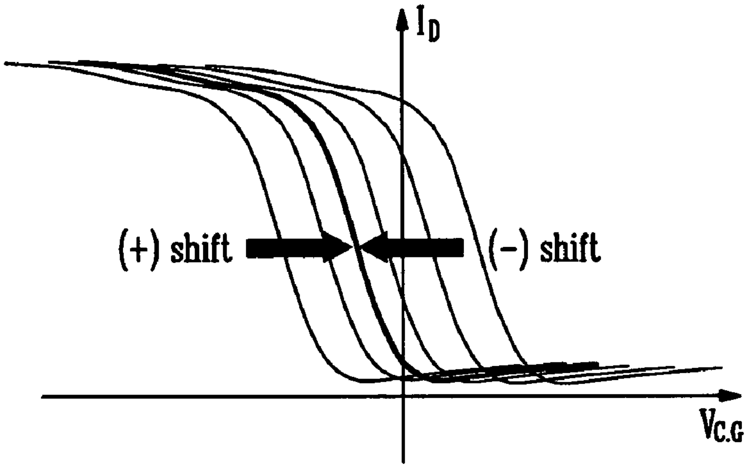
FIG. 3 illustrates a graph of current flowing into a drain of a transistor as a function of control gate voltage and changes in the threshold voltage of the transistor.
Figure 4:
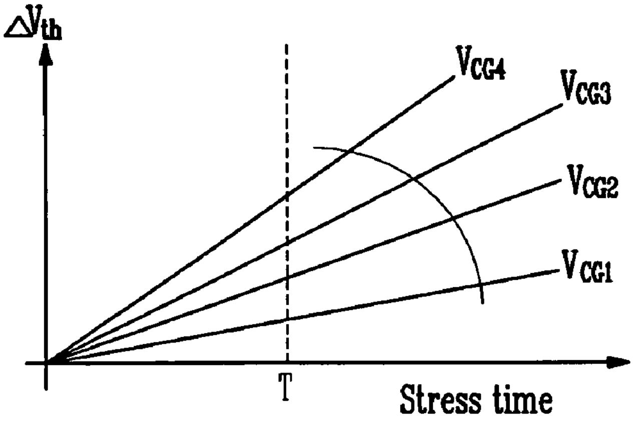
FIG. 4 illustrates a graph of a relationship between threshold voltage and stress time.

FIG. 3 illustrates a graph of current flowing into the drain of a transistor as a function of control gate voltage and changes in the threshold voltage of the transistor. In FIG. 3, the horizontal axis represents the voltage $V_{CG}$ of the control gate and the vertical axis represents the current $I_D$ flowing into the drain of the transistor. A thick curve in FIG. 3 represents an ideal curve. FIG. 4 illustrates a graph of a relationship between threshold voltage and stress time.

Referring to FIG. 3, if the threshold voltage is controlled, the amount of the current $I_D$ flowing into the drain of the transistor changes corresponding to the voltage $V_{CG}$ of the control gate. In particular, if the threshold voltage is raised, the curve moves from left to right (hereinafter referred to a "positive" (+) shift). If the threshold voltage is lowered, the curve moves from right to left (a "negative" (−) shift).

With respect to the curve representing the ideal change, the threshold voltage of the transistor is compensated to allow the amount of current flowing into the drain of the transistor corresponding to the voltage $V_{CG}$ of the control gate to follow the ideal curve.

In FIG. 4, the vertical axis represents a variation value of $\Delta V_{th}$ of the threshold voltage and the horizontal axis represents time. The variation value $\Delta V_{th}$ of the threshold voltage can be changed by controlling the stress time and the voltage of the control gate.

As shown in FIG. 4, if the voltage $V_{CG}$ of the control gate is large, the variation value $\Delta V_{th}$ of the threshold voltage may become large. If the voltage $V_{CG}$ of the control gate is small, the variation value $\Delta V_{th}$ of the threshold voltage may become small.

Figure 5:
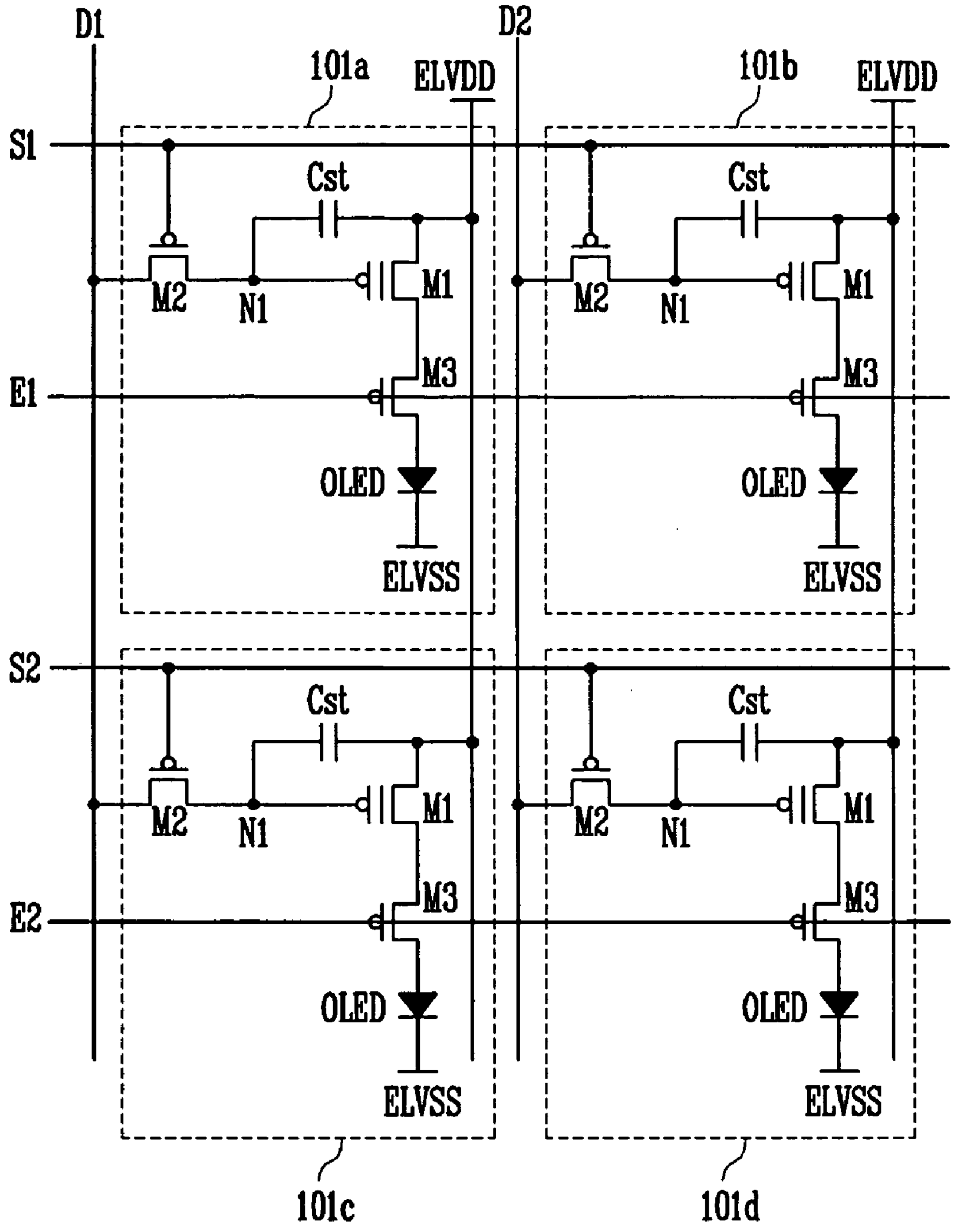
FIG. 5 illustrates a circuit view of a portion of a pixel unit of the organic light emitting display of FIG. 1.

FIG. 5 illustrates a circuit view of a portion of a pixel unit 100 of the organic light emitting display of FIG. 1. Referring to FIG. 5, a 2×2 portion of the pixel unit 100 is illustrated, including first to fourth pixels 101*a*, 101*b*, 101*c*, and 101*d*. As shown in FIG. 5, each pixel 101 may include a first transistor M1, a second transistor M2, a third transistor M3, a capacitor Cst, and an organic light emitting diode OLED. Each first transistor M1 may include an NVM element, e.g., the NVM element illustrated in FIG. 2.

The amount of current flowing into any one of the first to fourth pixels 101*a*, 101*b*, 101*c*, and 101*d* may be measured as described below.

In order to measure the current flowing into the first pixel 101*a*, a first voltage, e.g., 0 V, is supplied to a first power line from the first power source ELVDD, and a second voltage, e.g., a negative voltage, is supplied to a second power line from the second power source ELVSS. Data signals, e.g., having voltage of −15 V to +15 V, are supplied to a first data line D1, and third voltage, e.g., a high voltage, is applied to a second data line D2. Scan signals having a fourth voltage, e.g., a voltage much lower than the voltage of the data signals provided to the first data line D1, are supplied to a first scan line S1. Scan signals having a fifth voltage, e.g., a high state voltage, are supplied to a second scan line S2. Light emitting control signals having a sixth voltage, e.g., a low state voltage, are supplied to a first light emitting control line E1. Light emitting control signals having a seventh voltage, e.g., a high state voltage, are supplied to a second light emitting control line E2. The third voltage, the fifth voltage and the seventh voltage may be the same.

With the power sources and signals provided as described above, in the first pixel 101*a*, the data signals flow through the first data line D1, and the second transistor M2 is turned-on by the voltage applied through the first scan line S1. Thus, the voltage of the data signals is supplied to a first node N1. Additionally, the voltage of the data signals is supplied from the first node N1 to the gate of the first transistor M1. The voltage of 0 V is supplied from the first power source ELVDD to the source of the first transistor M1. The third transistor M3 is turned-on by the light emitting control signal transferred through the first light emitting control line E1, so that current flows from the source to the drain of the first transistor M1, through the third transistor M3, and to the organic light emitting diode OLED.

However, with respect to the second pixel 101*b*, although the second transistor M2 is turned-on by the scan signals transferred through the first scan line S1 and the third transistor M3 is turned-on by the light emitting control signals transferred through the first light emitting control line E1, the first transistor M1 is turned-off by the high state data signals transferred through the second data line D2, thereby blocking the generation of current.

In the case of the third pixel 101*c*, the second transistor M2 is turned-off by the scan signals transferred through the second scan line S2, preventing the data signals transferred through the first data line D1 from being supplied to the control gate of the first transistor M1. Also, the third transistor M3 is turned-off by the light emitting control signals transferred through the second light emitting control line E2, blocking the generation of current.

In the case of the fourth pixel 101*d*, the high state data signals are transferred through the second data line D2. Further, the scan signals transferred through the second scan line S2 have the high state voltage, so that the second transistor M2 is turned-off. The third transistor M3 is turned-off by the light emitting control signals transferred through the second light emitting control line E2, blocking the generation of current. Thus, with the power sources and signals provided as described above, current flows only in the first pixel 101*a*.

The above-described operations may be extended such that the current flowing into the second pixel 101*b*, the third pixel 101*c*, and the fourth pixel 101*d* can be measured in sequence. In particular, it will be appreciated that the operation of the above-described first through fourth pixels 101*a* through 101*d* may be controlled by the data signals transferred through the data lines D1 and D2, the scan signals transferred through the scan lines S1 and S2, and the voltage of the light emitting control signals transferred through the light emitting control lines E1 and E2, such that the current flowing into the second pixel 101*b*, the third pixel 101*c*, and the fourth pixel 101*d* can be measured in sequence.

Compensation of the threshold voltage of the first transistor M1 will now be described. The compensation value for compensating the threshold voltage of the first transistor M1 in the first pixel 101*a* may be determined using the current measured above.

The compensation value can be determined using the values of the voltage of the control gate and the current flowing into the first pixel 101*a*. The case of compensating the threshold voltage by raising the threshold voltage, as well as the case of compensating the threshold voltage by lowering the threshold voltage, may be based on the determined value, as will now be described in detail.

The case where the threshold voltage of the first pixel 101*a* is compensated by raising the threshold voltage will now be described.

For the first pixel 101*a*, the first power source ELVDD applies a voltage much lower than the low state, and the second power source ELVSS applies the voltage of 0 V. Data signals having the high state voltage are transferred through the first data line D1, the scan signal having the low state voltage is transferred through the first scan line S1, and the light emitting signal transferred through the first light emitting control line E1 becomes a high state. Accordingly, electrons are injected into the floating gate of the first transistor M1 in the first pixel 101*a*, so that the threshold voltage is raised. Electrons may be caused to flow into the floating gate of the first transistor M1 at a rate that depends on the voltage of the data signals.

As described above, electrons may be caused to flow into the floating gate of the first transistor M1 of the first pixel 101*a*, thereby increasing the threshold voltage of the first transistor, when a high state voltage, i.e., a data signal having a high voltage, is transferred to the gate of the first transistor M1, a voltage lower than a low state voltage is provided by the first power source ELVDD to the source of the first transistor M1, and a voltage of 0 V is supplied from the second power source ELVSS. The low state voltage may be provided by the second power source ELVSS during an image-display operation of the organic light emitting diode, i.e., when current flows in the organic light emitting diode to display images.

Additionally, data signals having the low state voltage are transferred through the second data line D2, scan signals having the high state voltage are transferred through the second scan line S2, and the light emitting signal transferred through the second light emitting control line E2 becomes a high state.

It will be appreciated that the compensation of the threshold voltage can be controlled by changing the voltage of the first power source ELVDD. In particular, to increase the compensation of the threshold voltage, the voltage of the first power source ELVDD may be lowered. To reduce the compensation of the threshold voltage, the voltage of the first power source ELVDD may be raised.

With respect to the second pixel 101*b*, although the scan signals transferred thorough the first scan line S11 are in a low state, the data signals transferred through the second data line D2 have the low state voltage. Accordingly, the second transistor M2 is turned-off and the control gate of the first transistor M1 is turned-off, so that the threshold voltage of the first transistor M1 in the second pixel 101*b* is not compensated.

In the case of the third pixel 101*c*, although the data signals transferred through the first data line D1 are in a high state, the scan signals transferred through the second scan line S2 are in a high state. Accordingly, the second transistor M2 is turned-off and the control gate of the first transistor M1 is thus placed in a floating state. Therefore, the threshold voltage of the first transistor M1 in the third pixel 101*c* is not compensated.

In the case of the fourth pixel 101*d*, the scan signals transferred through the second scan line S2 are in a high state, so that the second transistor M2 is turned off and the control gate of the first transistor M1 is placed in a floating state. Therefore, the threshold voltage of the first transistor M1 in the fourth pixel 101*d* is not compensated.

The above-described operations may be extended to the remaining pixels. In particular, if the voltages of the data signals and the scan signals are sequentially controlled, the threshold voltages of the second pixel to the fourth pixel 101*b*, 101*c*, and 101*d* may also be compensated.

The case where the threshold voltage of the first pixel 101*a* is compensated by lowering the threshold voltage will now be described.

For the first pixel 101*a*, the first power source ELVDD applies the high state voltage and the second power source ELVSS applies the voltage of 0 V. Data signals having a voltage much lower than the low state are transferred through the first data line D1. The scan signal transferred through the first scan line S1 has a voltage much lower than the voltage of the data signals flowing into the first data line D1. The light emitting signal transferred through the first light emitting control line E1 becomes a high state. Accordingly, electrons stored in the floating gate are extracted into the channel region of the first transistor M1 so that the threshold voltage of the first transistor M1 of the first pixel 101*a* is lowered.

Additionally, the data signals having the high state voltage are transferred through the second data line D2, the scan signals transferred through the second scan line S2 have the high state voltage, and the light emitting signal transferred through the second light emitting control line E2 becomes a high state.

The compensation of the threshold voltage can be controlled by changing the voltage of the first data line D1. In particular, to increase the compensation of the threshold voltage, the voltage of the first data line D1 may be lowered. To reduce the compensation of the threshold voltage, the voltage of the first data line D1 may be raised.

With respect to the second pixel 101*b*, the scan signals transferred through the first scan line S1 are in a low state and the data signals transferred through the second data line D2 have the high state voltage. As a result, the first transistor M1 of the second pixel 101*b* is turned-off. Accordingly, the threshold voltage of the first transistor M1 of the second pixel 101*b* is not compensated.

In the case of the third pixel 101*c*, the data signals transferred through the first data line D1 are in a high state and the scan signals transferred through the second scan line S2 are in a high state. Accordingly, the second transistor M2 is turned-off and the control gate of the first transistor M1 is placed in a floating state. Therefore, the threshold voltage of the first transistor M1 of the third pixel 101*c* is not compensated.

In the case of the fourth pixel 101*d*, the scan signals transferred through the second scan line S2 are in a high state. Accordingly, the second transistor M2 is turned off so that the control gate of the first transistor M1 is placed in a floating state. Therefore, the threshold voltage of the first transistor M 1 of the fourth pixel 101*d* is not compensated.

The above-described operations may be extended to the remaining pixels. In particular, if the voltages of the data signals and the scan signals are sequentially controlled, the threshold voltages of the second pixel to the fourth pixel 101*b*, 101*c*, and 101*d* may also be compensated.

If the threshold voltages of the first transistors M1 are compensated using the operations described above, the organic light emitting display may display a uniform screen. Additionally, the pixel circuits may be simplified by eliminating the need for a separate threshold voltage compensation circuit.

Figure 6:
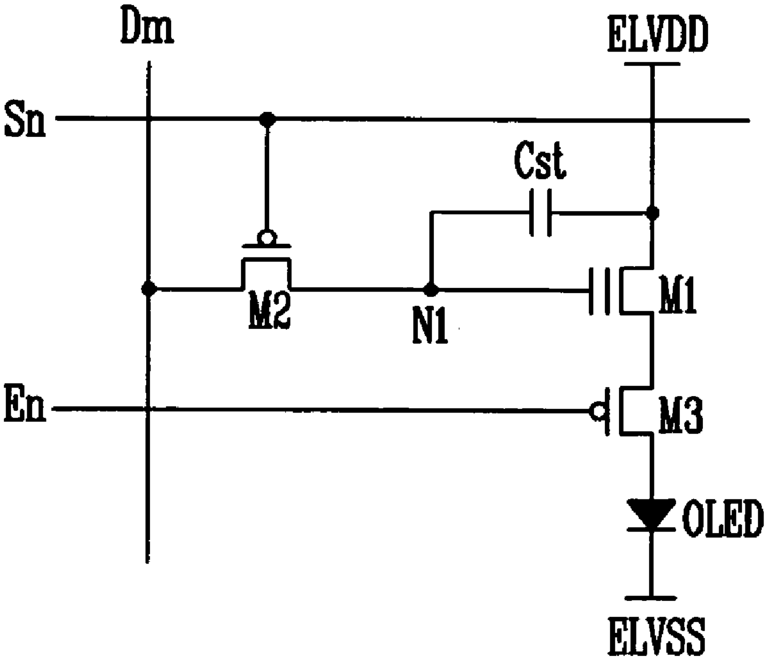
FIGS. 6 and 7 illustrate embodiments of pixel circuits in the organic light emitting display of FIG. 1.
Figure 7:
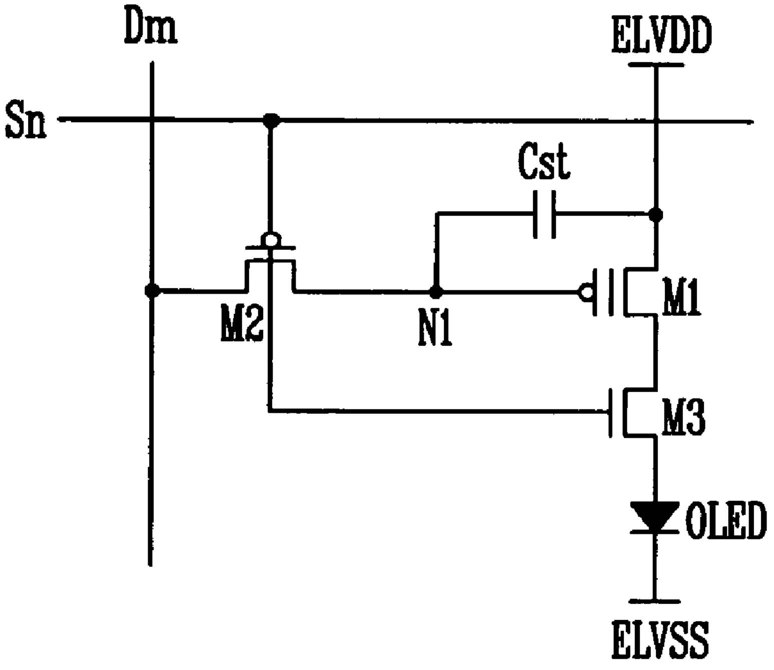

FIGS. 6 and 7 illustrate embodiments of pixel circuits in the organic light emitting display of FIG. 1. Referring to FIG. 6, the first transistor M1 may be implemented as an NVM element of an NMOS type. As illustrated in FIG. 4, if the voltage of the control gate is lowered, the threshold voltage is lowered and, if the voltage of the control gate is raised, the threshold voltage is raised.

Referring to FIG. 7, the third transistor M3 may be implemented as an NMOS transistor. Further, the second transistor M2 and the third transistor M3 may be coupled to a same scan line Sn. Accordingly, the second transistor M2 and the third transistor M3 may be alternately turned-on. Therefore, when the data signals are supplied to the pixel, the third transistor M3 is turned-off, and then the third transistor M3 is turned-on after a predetermined time so that current flows in the pixel.

As described above, a threshold voltage of a transistor may be compensated by storing a compensation value for the threshold voltage in the transistor using a non-volatile memory element. Accordingly, a separate threshold compensation circuit may be omitted, thereby simplifying the circuit structure.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A pixel, comprising:

an organic light emitting diode;

a first transistor having a source coupled to a first power source, a control gate coupled to a first node, and a drain coupled to a second node, wherein the first transistor includes a floating gate and an insulating layer between the floating gate and the control gate;

a second transistor having a source coupled to a data line, a drain coupled to the first node, and a gate coupled to a scan line;

a third transistor having a source coupled to the second node, a drain coupled to the organic light emitting diode, and a gate coupled to one of a light emitting control line and the scan line; and a capacitor coupled between the first power source and the first node.

2. The pixel as claimed in claim 1, wherein the gate of the third transistor is coupled to the light emitting control line.

3. The pixel as claimed in claim 2, wherein the first, second, and third transistors are PMOS transistors.

4. The pixel as claimed in claim 2, wherein the first transistor is an NMOS transistor, and the second and third transistors are PMOS transistors.

5. The pixel as claimed in claim 1, wherein:

the gate of the third transistor is coupled to the scan line, and the third transistor is in an on-state when the second transistor is in an off-state.

6. The pixel as claimed in claim 5, wherein the first and second transistors are PMOS transistors, and the third transistor is an NMOS transistor.

7. The pixel as claimed in claim 1, the first transistor further comprises:

a non-volatile memory element.

8. The pixel as claimed in claim 7, wherein the non-volatile memory element includes:

an insulating film on a silicon substrate;

a floating gate on the insulating film;

an oxide-nitride-oxide (ONO) layer on the floating gate;

a control gate on the ONO layer; and a source and a drain on the silicon substrate.

9. An organic light emitting display, comprising:

a pixel unit having a plurality of pixels;

a data driver coupled to data lines of the pixel unit; and a scan driver coupled to scan lines of the pixel unit, wherein each pixel includes:

an organic light emitting diode;

a first transistor having a source coupled to a first power source, a control gate coupled to a first node, and a drain coupled to a second node, wherein the first transistor includes a floating gate and an insulating layer between the floating gate and the control gate;

a second transistor having a source coupled to a data line, a drain coupled to the first node, and a gate coupled to a scan line;

a third transistor having a source coupled to the second node, a drain coupled to the organic light emitting diode, and a gate coupled to one of a light emitting control line and the scan line; and a capacitor coupled between the first power source and the first node.

10. The organic light emitting display as claimed in claim 9, wherein:

the scan driver is coupled to light emitting control lines of the pixel unit, and the gate of the third transistor of each pixel is coupled to a light emitting control line.

11. The organic light emitting display as claimed in claim 10, wherein the first, second, and third transistors are PMOS transistors.

12. The organic light emitting display as claimed in claim 10, wherein the first transistor is an NMOS transistor, and the second and third transistors are PMOS transistors.

13. The organic light emitting display as claimed in claim 9, wherein:

the gate of the third transistor of each pixel is coupled to the scan line, and the third transistor of each pixel is in an on-state when the second transistor of the pixel is in an off-state.

14. The organic light emitting display as claimed in claim 13, wherein the first and second transistors are PMOS transistors, and the third transistor is an NMOS transistor.

15. The organic light emitting display as claimed in claim 9, the first transistor further comprises:

a non-volatile memory element.

16. The organic light emitting display as claimed in claim 15, wherein the non-volatile memory element includes:

an insulating film on a silicon substrate;

a floating gate on the insulating film;

an oxide-nitride-oxide (ONO) layer on the floating gate;

a control gate on the ONO layer; and a source and a drain on the silicon substrate.

* * * * *